United States Patent [19]

Cuomo et al.

[11] 3,869,322

[45] Mar. 4, 1975

[54] AUTOMATIC P-N JUNCTION FORMATION DURING GROWTH OF A HETEROJUNCTION

[75] Inventors: Jerome J. Cuomo, Bronx; Harold J. Hovel, Putnam Valley, both of N.Y.

[73] Assignee: International Business Machines Corporation, Armonk, N.Y.

[22] Filed: Oct. 15, 1973

[21] Appl. No.: 406,415

[52] U.S. Cl. ................ 148/188, 148/186, 148/187, 148/175, 117/106 A, 117/201 R, 252/62.3 GA, 357/16, 29/576

[51] Int. Cl. .............................................. H01l 7/36

[58] Field of Search ............ 148/188, 175; 117/201, 117/106 A; 252/62.3 GA; 357/16; 29/576

[56] References Cited

UNITED STATES PATENTS

| | | | |
|---|---|---|---|
| 2,909,453 | 10/1959 | Losco et al. | 148/188 X |
| 3,450,581 | 6/1969 | Shortes | 148/186 X |
| 3,683,240 | 8/1972 | Pankove | 148/175 X |
| 3,811,963 | 5/1974 | Hawrylo et al. | 148/172 |

*Primary Examiner*—G. Ozaki
*Attorney, Agent, or Firm*—Sughrue, Rothwell, Mion, Zinn & Macpeak

[57] ABSTRACT

A process for the preparation of a homojunction in a semiconductor substrate, e.g., a p-n junction, during growth of a heterojunction between the substrate and a second semiconductor consisting of either gallium nitride or aluminum nitride where aluminum atoms from the aluminum nitride or gallium atoms from the gallium nitride diffuse into the substrate in a region of the substrate adjacent the aluminum nitride or gallium nitride to form the homojunction.

18 Claims, 3 Drawing Figures

AUTOMATIC P-N JUNCTION FORMATION DURING GROWTH OF A HETEROJUNCTION

BACKGROUND OF THE INVENTION

1. Field of the Invention

This invention comprises a process for the preparation of a homojunction in a first semiconductor body by creation of regions of differing conductivity types, for example, a p-n junction, and a heterojunction between the first semiconductor and a second semiconductor at its surface. Herein, the term "homojunction" will be used for simplicity to described a junction in a semiconductor between regions of differing conductivity types.

More particularly, this invention comprises a process whereby a homojunction is automatically formed in a semiconductor substrate during the growth of a heterojunction at the semiconductor substrate surface utilizing the deposition of a second material to form the heterojunction and the diffusion of atoms of this second material into the semiconductor substrate to form a homojunction. The process comprises the utilization of aluminum nitride or gallium nitride to form a layer on a semiconductor substrate, thereby forming a heterojunction, and a diffusion of aluminum atoms from the aluminum nitride or gallium atoms from the gallium nitride into the substrate to form a homojunction.

2. Description of the Prior Art

In the semiconductor industry, there are many instances in which a p-n junction or arrays of such junctions and other junction devices such as transistors are desired on a semiconductor substrate. Heterojunction devices such as bistable switches for non-volatile memories (described in Applicants' copending application Ser. No. 260,861) are also desirable for various computer applications.

All known prior art heterojunction bistable switching devices display a lower resistive state which is ohmic and which passes through the origin of a current-voltage plot. When arrays of these devices are fabricated, the ohmic (resistor-like) nature of the current-voltage characteristics thereof results in "sneak paths" which can cause an erroneous information readout. To eliminate this effect with prior art heterojunction switching devices, a rectifier must be placed in series with the heterojunction in each device. As such rectifiers, Schottky barriers, p-n junction diodes and connection of the emitter to the collector of a transistor (i.e., a so-called floating base) have been proposed or utilized.

These prior art aproaches to eliminate the generation of erroneous information from heterojunction switching devices are disadvantageous. The added rectifier requires additional photomasking, oxide growth, diffusion steps and the like to fabricate such, thus lowering the yield and increasing the cost of the device. In addition, a lowering of the bit density can occur since many of the prior art approaches require increased semiconductor chip surface area when the rectifiers are positioned horizontally on a semiconductor chip rather than vertically in a semiconductor chip.

The process of this invention eliminates the above disadvantages of the prior art heterojunction switching devices by permitting the formation of a homojunction directly in series with the heterojunction switching device by a solid state diffusion of aluminum atoms or gallium atoms from an aluminum nitride or gallium nitride source layer deposited on the semiconductor substrate to form the heterojunction.

Doping of a semiconductor body with impurity atoms to create regions in the semiconductor body of differing conductivity types utilizing gaseous and solid diffusion processes and the use of gallium and aluminum atoms as dopant impurites are well known in the semiconductor art.

It is known from the disclosure of U.S. Pat. No. 3,533,036 Werner et al, to create regions of differing conductivity types in a semiconductor body of, for example, n-type silicon using gallium or indium atoms as dopant atoms for the silicon. In the process described in Werner et al., a semiconductor body surface partitioned into at least one first surface region and at least one second surface region utilizing a silicon dioxide masking is treated with pure gallium or pure indium in gaseous form to provide doped regions in the semiconductor body adjacent the unmasked surface areas. The silicon dioxide layer is applied in a discontinuous manner to limit the region of doping in the doping process and this permits doped zones of a predetermined area and location in a semiconductor body.

U.S. Pat. No. 2,794,846, Fuller, and U.S. Pat. No. 3,574,009, Chizinsky, disclose processes for doping of a semiconductor body utilizing a solid diffusion technique. In Fuller, a clear ceramic glaze containing a compound of the dopant impurity, for example, $P_2O_5$ or $B_2O_3$, is applied to a semiconductor substrate, for example, silicon, and by diffusion of the phosphorus or boron atoms from the ceramic glaze into the silicon, a thin subsurface layer of n-type or p-type silicon is formed, respectively. The Chizinsky et al disclosure is of a process for controlling the doping of semiconductors in which a semiconductor is exposed to a gaseous atmosphere to form a dopant atom source layer on the surface of the semiconductor, and the dopant atoms are then partly diffused into the semiconductor body, the amount of dopant penetrating into the semiconductor body being dependent upon the diffusion coefficient, which is temperature dependent, and the time. Subsequently, oxygen is passed over the semiconductor body with the oxygen reacting with the semiconductor at the interface between the semiconductor and the source layer to provide an oxide barrier to prevent additonal dopant from the source layer from being driven into the semiconductor. The semiconductor body is then exposed to a temperature suitable for diffusion of the driven-in dopant to achieve the desired dopant concentration and dopant depth in the semiconductor body.

The above discussed references essentially describe the state-of-the-art with respect to doping approaches utilizing gallium or indium as a dopant in the gaseous form and diffusion into a semiconductor body and the utilization of a solid dopant atom source layer and diffusion in a solid state manner from the solid dopant source layer into the soild semiconductor body.

While the above discussed references are directed to the creation of regions within a semiconductor body having different conductivity characteristics utilizing doping approaches, none of these references provide for the formation of a heterojunction, and none of them provide for the integral formation of a homojunction as a part of the heterojunction growth.

U.S. Pat. No. 3,623,925 discloses a Schottky-barrier diode having superior reverse-bias operating characteristics and a process for the preparation of such a Schottky-barrier diode. In the process disclosed, a highly conductive metallic layer overlying a region of a semiconductor material is heated to a temperature sufficient to enable solid state diffusion to occur between the semiconductor and the metal but below the temperature at which a eutectic between the two materials would be formed. A metal-semiconductor junction is formed below the orginal surface of the semiconductor region and the disclosure is that unwanted impurities are prevented from interfering with the operation of the diode when the disclosed process is employed.

None of the references discussed above teach the utilization of a growth of a layer of aluminum nitride or gallium nitride on a semiconductor as a source of dopant atoms and thereby the solid state-solid state diffusion doping of the semiconductor to form both a homojunction in the semiconductor as an integral part of the growth process for the formation of the heterojunction between the semiconductor and the grown layer of aluminum nitrde or gallium nitride.

Since known heterojunction switching devices must employ additonal devices to minimize erroneous information readouts, the process of the present invention, providing not only a heterojunction but also a homojunction as an integral part of the process, is quite advantageous. When the heterojunction and the homojunction are electrically connected in series, the necessity for electrically connecting a rectifier as is required with prior art heterojunction switching devices as an additional component is eliminated and the disadvantages existing in known heterojunction switching devices of the prior art are overcome.

Accordingly, it is an object of this invention to provide a process whereby automatic homojunction formation directly in series with a heterojunction can be obtained as an integral process.

It is also an object of this invention to provide a heterojunction switching device having a bi-stable switching property as an attendant part of the growth process together with automatic formation of a p-n homojunction.

It is also an object of this invention to provide a heterojunction switching device, the output from which is rectified, without the necessity for the utilization of additional processing steps, such as photomasking, oxide growth and diffusion steps in the fabrication thereof, by providing a homojunction in series with the heterojunction.

It is additionally an object of this invention to provide a simple and inexpensive process for producing a semiconductor body containing both a heterojunction thereon and a homojunction therein.

Another object of this invention is to provide a semiconductor device utilizing a relatively low temperature diffusion process.

Additionally, it is an object of this invention to provide a process for preparing a semiconductor device having a high surface concentration of dopant atoms but at the same time a very shallow diffusion depth, e.g., where the junction depth lies in the range of 100 A to 3,000 A.

SUMMARY OF THE INVENTION

These and other objects of the invention, which will become apparent from the discussions appearing hereinafter, are accomplished by the process of this invention.

The process of this invention comprises the preparation of a homojunction in a semiconductor substrate and a heterojunction at the substrate surface by growing a layer of or an area of gallium nitride or aluminum nitride on the substrate to form the heterojunction therebetween and integrally to form the homojunction due to diffusion into the substrate of dopant atoms from the grown gallium nitride or aluminum nitride source layer. The gallium atoms from the gallium nitride or the aluminum atoms from the aluminum nitride diffuse into the substrate in the regions of the substrate adjacent the aluminum nitride or gallium nitride to form a homojunction in the substrate.

BRIEF DESCRIPTION OF THE ACCOMPANYING DRAWINGS

DETAILED DESCRIPTION OF THE INVENTION

Figure 1:
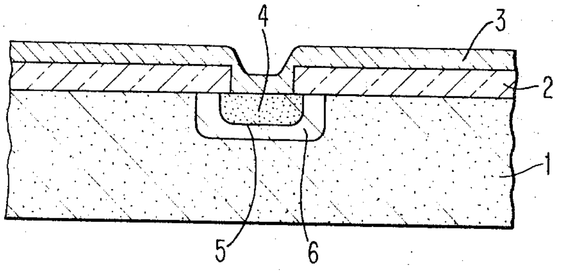
FIG. 1 is a sectional view of one embodiment of a semiconductor device prepared by the process of this invention.

Essentially, the process of this invention comprises the deposition of aluminum nitride or gallium nitride onto a semiconductor substrate and the diffusion of aluminum atoms from the aluminum nitride or gallium atoms from the gallium nitride into the substrate in the regions adjacent to the aluminum nitride or gallium nitride to thereby form a homojunction in the substrate.

As the semiconductor, silicon, germanium, silicon carbide, germanium carbide and like semiconductor materials can be employed as the substrate in the process of this invention. Silicon is preferred as the semiconductor substrate and silicon having n-type conductivity is especially preferred. The preparation of n-type silicon is well known to one of ordinary skill in the art and the inclusion of dopant materials such as arsenic, phosphorus, antimony and the like is well known in the art to provide the n-type character to the silicon.

Generally, an n-type semiconductor substrate is used in accordance with the present invention, but it is also possible to utilize a substrate having intrinsic or p-type conductivity characteristics and to create n-type conductivity areas or stripes therein by the use of well known masking and diffusion doping techniques. For example, silicon can be doped with arsenic, phosphorus or antimony to create n-type conductivity and a heterojunction can then be formed in accordance with the process to be detailed hereinafter at the silicon surface or at the n-type silicon surface areas. In addition, if desired, silicon of an intrinsic conductivity can be employed as the semiconductor substrate utilizing the process of this invention with the formation of regions in the intrinsic silicon containing gallium and aluminum dopant atoms.

Gallium nitride and aluminum nitride, used to form a layer on the semiconductor substrate in the process of this invention, are known materials. However, the utilization of these materials as a source layer from which gallium atoms or aluminum atoms can be diffused in a solid-solid manner into a semiconductor substrate is an essential and novel characteristic of the present invention. The diffusion of the gallium atoms from the gallium nitride source layer or the aluminum atoms from the aluminum nitride source layer is both temperature and time dependent and this dependency permits quite accurate control of the depth of the homojunction in the semiconductor substrate. It has proven particularly difficult in prior art techniques to produce very shallow junction depths where the source of the dopant atoms has been in high concentration. Utilizing the process of this invention involving the gallium nitride or aluminum nitride source layer permits not only the preparation of junctions deep within the semiconductor substrate (e.g., greater than 3,000 A) but also the formation of very shallow junctions (e.g., 100 A to 3,000 A) in the substrate in spite of the very high surface concentration.

In the process of this invention, aluminum nitride or gallium nitride is grown on a semiconductor substrate and this layer provides the source of the atoms diffusing into the substrate. The aluminum nitride or gallium nitride can be grown on the semiconductor substrate utilizing a number of growth techniques. For example, vapor growth techniques have been reported in the prior art in which various gallium compounds in the vapor phase are reacted with ammonia to grow gallium nitride layers on various substrates. Also, a sputtering technique utilizing elemental aluminum or gallium and a reactive nitrogen atmosphere can be employed to grow the aluminum nitride or gallium nitride on a semiconductor substrate. Additionally, a reactive vacuum evaporation technique employing elemental gallium or aluminum in a reactive nitrogen atmosphere can be employed to grow the aluminum or gallium nitride layer. Reference can be made to literature articles such as H. P. Maruska et al., Applied Physics Letters, Vol. 15, pages 327, 1969 and T. L. Chu, Journal of the Electrochemical Society, Vol. 118, page 1200 (1971) for discussion of GaN vapor growth, to B. B. Kosicki et al for discussion of nitride reactive evaporation, and to Applicants' article in Applied Physics Letters, Vol. 20, page 71, (1972) and abandoned application Ser. No. 184,405 for discussion of nitride sputtering technique. Vapor growth techniques utilize temperatures in the 700°–900°C range for periods of around 15 minutes – 2 hours, while sputtering and evaportion techniques utilize substrate temperatures from 0°C to 800°C for periods of 10 minutes to 4 hours, mhours, with 600°C and 30 minutes being preferred for layers of 1,000–3,000 angstroms in thickness. Within the scope of this invention, the temperatures and times are chosen with the diffusion of the Al or Ga atoms into the substrate kept in mind. For example, deeper diffusions result when the nitride growth temperature is high, and the nitride thickness can then be controlled by varying the partial pressures of the gases or reactive nitrogen and by varying the time. Shallower diffusion depths are obtained by lowering the temperature and again using the partial pressures and time to control the nitride layer thickness.

As discussed above, the formation of a source area or layer of an aluminum nitride or gallium nitride material grown utilizing one of the techniques set forth above on the semiconductor substrate is all that is necessary in order to not only prepare the heterojunction comprising the aluminum nitride/gallium nitride layer and the substrate surface, but due to the diffusion of the aluminum atoms from the aluminum nitride source or the gallium atoms from the gallium nitride source, occurring as an integral part of the process in the substrate, a doped area containing aluminum atoms or gallium atoms giving rise to the formation of a homojunction, for example, a p-n junction where the substrate is an n-type semiconductor material.

The thickness of the aluminum nitride or gallium nitride layer which is the source for the diffusing materials is not overly important so long as a sufficient amount of aluminum or gallium is present to achieve the desired impurity concentration. Considering the ease of layer formation using available equipment, usually a layer thickness of from about 500 A to about 2 microns is used. To optimize the properties of a bistable switch, the thickness of the aluminum nitride or gallium nitride is most preferably in the range of 1,000 A to 3,000 A, regardless of the desired junction depth.

The formation of this homojunction in a semiconductor substrate is due to the diffusion of the aluminum from the aluminum nitride or the gallium from the gallium nitride into the substrate with the region in the substrate adjoining the aluminum nitride or gallium nitride source being converted to a p-type conductivity. The positioning of the homojunction in the semiconductor substrate is determined by the depth of diffusion of the aluminum or gallium atoms into the substrate from the source aluminum nitride or gallium nitride. The depth of this p-type region is dependent upon the substrate temperature during the growth of the layer and the time period for which the substrate is held at this diffusion temperature.

By utilization of the gallium nitride or aluminum nitride process of this invention in which a layer or area of gallium nitride or aluminum nitride is grown on a semiconductor substrate, the maximum surface concentration of the aluminum or gallium atoms of the interface between the substrate and the nitride layer is essentially equal to the theoretical lattice concentration in the nitride, this theoretical lattice concentration being on the order of $10^{22}$ atoms of aluminum or gallium per cubic centimeter. The diffusion of the gallium or aluminum atoms into the semiconductor substrate from the gallium nitride or aluminum nitride source layer is a solid-solid diffusion with the diffusion being described by the following formula:

$$N(x, t) = No/2\ (erfc\ X/2\sqrt{Dt})$$

where N is aluminum or gallium concentration in the substrate at a depth $x$ and at a time $t$, the time being the time at which the substrate is held at a temperature sufficiently high to permit diffusion of the gallium or aluminum atoms into the substrate, $N_0$ is the surface concentration of the gallium or aluminum atoms in the gallium nitride or aluminum nitride layer and D is the diffusion coefficient. Thus, with a surface concentration of $10^{22}$ atoms per cubic centimeter of either gallium or aluminum atoms at the semiconductor substrate-nitride interface, the times required to achieve a homojunction at a particular depth in the substrate are set forth in Table 1 below at various substrate temperatures from 600° to 900°C.

Table 1

| T°C | $D_{Ga}$ ($cm^2/sec$) | $D_{Al}$ ($cm^2/sec$) | Depth (A) | $Time_{Ga}$ (sec) | $Time_{Al}$ (sec) |
|---|---|---|---|---|---|
| 900 | $6\times10^{-15}$ | $1.4\times10^{-14}$ | 1000 | 641 | 275 |
| 800 | $6\times10^{-16}$ | $1.4\times10^{-15}$ | do. | 6410 | 2750 |
| do. | do. | do. | 100 | 64 | 27.5 |
| 700 | $6\times10^{-17}$ | $1.4\times10^{-16}$ | 500 | 16,000 | 6880 |
| do. | do. | do. | 100 | 640 | 275 |
| 600 | $6\times10^{-18}$ | $1.4\times10^{-17}$ | 100 | 6400 | 2750 |

Note: Diffusion Details: $N_o = 10^{22}$ atoms/$cm^3$, $\rho$(n Si) = $2\times10^{-2}$ Ω cm Similarly, for a surface concentration of $10^{19}$ atoms/$cm^3$, (assuming that the theoretical lattice concentration of the aluminum or gallium atoms in the aluminum nitride or gallium nitride surface layer is not achieved in the silicon but a surface concentration only one one-thousandth of the theoretical lattice concentration is achieved, i.e., a gallium or aluminum atom concentration of $10^{19}$ atoms per cubic centimeter) the process of this invention can be suitably utilized to prepare homojunctions in a semiconductor substrate using diffusion temperatures in the range from 600° to 1,000°C with a practical period of time for the diffusion. A higher substrate temperature may be desirable in the processing sequence exemplified in Table 2 due to the lower surface concentration.

Most practically, the diffusion can be completed in times on the order of 4 or 5 hours. Greater periods of time can be used but are increasingly undesirable, and for most common semiconductor systems lesser periods of time require increasing exactness in process control which is generally not justified by the time saved.

Table 2 shows the homojunction depths achievable at various semiconductor substrate temperaturs and diffusion times where the surface concentration is only about one one-thousandth of the theoretical lattice concentration.

mit the formation of the layer but which is too low to permit any appreciable diffusion of the gallium atoms or aluminum atoms into the substrate. For example, at temperatures below about 500°C. for gallium nitride and below about 450°–500°C. for aluminum nitride, substantially no diffusion of the gallium or aluminum atoms into the semiconductor substrate occurs. Where desired, the gallium nitride or aluminum nitride layer can be grown on the semiconductor substrate, for example, using sputtering or reactive vacuum evaporation as described above, to achieve the growth of the layer, and at some later time, an annealing step in which the gallium atoms or the aluminum atoms are diffused into the substrate conducted, using the same time-temperature data as in Tables 1 and 2 for the desired junction depths. In such an instance, where annealing is conducted as a second operation from the growth of the aluminum nitride or gallium nitride layer, and not in the growth chamber and at high temperatures for obtaining deep junctions, it may be necessary that the gallium nitride or aluminum nitride layer be protected from dissociation due to the high temperatures employed. The term protection, as used herein, is intended to cover the use of a protective atmosphere or a protective layer to prevent this dissociation. Such a protective atmosphere can be an ammonia atmosphere Table 2

| T°C | $D_{Ga}$ ($cm^2/sec$) | $D_{Al}$ ($cm^2/sec$) | Depth (A) | Time (Ga) (sec) | Time (Al) (sec) |
|---|---|---|---|---|---|
| 1000 | $6\times10^{-14}$ | $1.4\times10^{-13}$ | 1000 | 400 | 172 |
| do. | do. | do. | 100 | 4 | 1.72 |
| 900 | $6\times10^{-15}$ | $1.4\times10^{-14}$ | 1000 | 4000 | 1720 |
| do. | do. | do. | 100 | 40 | 17.2 |
| 800 | $6\times10^{-16}$ | $1.4\times10^{-15}$ | do. | 400 | 172 |
| 700 | $6\times10^{-17}$ | $1.4\times10^{-16}$ | do. | 4000 | 1720 |
| 600 | $6\times10^{-18}$ | $1.4\times10^{-17}$ | do. | 40,000 | 17,200 |

Note: Diffusion Details: $N_o = 2\times10^{19}$ atoms/$cm^3$, $\rho$(n Si) = $2\times10^{-2}$Ω cm As can be seen from examination of the figures set forth in Tables 1 and 2 above, both shallow junction depths and deeper junction depths can be achieved utilzing various temperatures and times to diffuse the aluminum and gallium atoms into the semiconductor substrate. From Table 1 and Table 2, it is clear that various junction depths can be achieved utilizing the process of this invention and, depending upon the end use of the device to be constructed, appropriate diffusion times and temperatures can be employed to secure a junction at a desired depth in the substrate. It should also be noted that much longer time periods can be used at each temperature to achieve much deeper junction depths, from fractions of a micron up to several microns.

As an alternative embodiment of the process of this invention, the growth of the gallium nitride or aluminum nitride layer on a semiconductor substrate can be conducted at a temperature which is sufficient to per-which, due to the equilibrium involved with the aluminum nitride or gallium nitride and its dissociation products will prevent the dissociation of the aluminum nitride or gallium nitride during the annealing step. Similarly, a reactive nitrogen atmosphere can be employed to prevent the dissociation. It is also possible to protect against dissociation of the gallium nitride or aluminum nitride layer by depositing a protective layer of, for example, silicon dioxide, aluminum oxide and the like thereover to prevent the dissociation from occurring. In order to conduct the separate diffusion step (if desired) discussed above, it is only necessary to heat the semiconductor substrate with the grown aluminum nitride or gallium nitride in an enclosed area, for example, a furnace comprising simply a heated enclosed tube in which the atmosphere in the furnace is a protective atmosphere. Alternatively, if desired, the protective layer, such as a silicon dioxide layer, can be applied over the aluminum nitride or gallium nitride layer to achieve protection from dissociation and then annealing conducted. Such protective layers can be applied by sputtering, evaporation or vapor growth as is well known in the semiconductor art.

Turning now to one embodiment of a device prepared by the process of this invention, as described in FIG. 1, 1 comprises a semiconductor substrate, for example, silicon, which is doped with arsenic, phosphorus or antimony to provide the silicon with n-type characteristics. 2 comprises a silicon dioxide layer which is produced on the semiconductor substrate. Such a silicon dioxide layer can be employed where it is desired to grow the gallium nitride or aluminum nitride layer only on selected portions of the semiconductor substrate and produce a semiconductor wafer having a gallium nitride or an aluminum nitride layer in isolated areas. 3 designates a gallium nitride or aluminum nitride layer produced by one of the aforementioned techniques, for example, by utilizing a vacuum evaporation or sputtering technique. 4 designates the region in the semiconductor substrate 1 in which gallium atoms or aluminum atoms from the gallium nitride or aluminum nitride source layer 3 are diffused with 5 designating the p-n junction formed due to this diffusion, and 6 represents an n-type "stripe" region that can be incorporated, if desired.

As an alternative embodiment utilizing the process of this invention, the semiconductor substrate 1 can be intrinsic silicon or p-type silicon or the substrate 1 can be silicon doped in specific regions with arsenic, phosphorus or antimony, to provide, for example, a stripe of silicon of n-type characteristics in the semiconductor body. Where such an embodiment is employed, the gallium nitride or aluminum nitride layer 3 is then applied over the n-type silicon strip produced to form the p-n junction in this n-silicon stripe.

If desired, the silicon dioxide layer 2 can be applied onto a semiconductor substrate 1 of intrinsic silicon, a stripe pattern etched in the $SiO_2$ by photomasking techniques, and the n-type silicon stripe 6 formed using arsenic, phosphorous or antimony and conventional diffusion doping techniques. Subsequently, a second $SiO_2$ layer can be grown, islands (windows) etched by photomasking techniques and a gallium nitride or aluminum nitride layer 3 grown over the silicon dioxide masking layer (including in the windows) to form the heterojunctions at the interface between layer 3 and the surface of the silicon substrate 1. A region of p-type silicon 4 is formed by the diffusion of gallium or aluminum atoms from the gallium nitride or aluminum nitride source layer 3 into the semiconductor substrate 1 and stripe 6, with p-n junction 5 being formed in the n-type silicon stripe 6 previously prepared on the substrate 1. The nitride can be removed from unwanted (non-window) areas by standard masking and etching techniques.

If desired, a structure similar to that just described can also be formed by the alternative technique by omitting the second silicon dioxide layer, depositing a uniform aluminum or gallium nitride layer and etching this layer off everywhere but where the desired aluminum or gallium diffusion is to occur.

Such a device as set forth above can be connected with terminals attached to the silicon semiconductor substrate 1 and the gallium nitride or aluminum nitride layer 3 to provide a heterojunction and a p-n junction electrically connected in series and vertically arranged in the semiconductor substrate 1. This provides the ability to efficiently use a semiconductor body as described.

Figure 2:
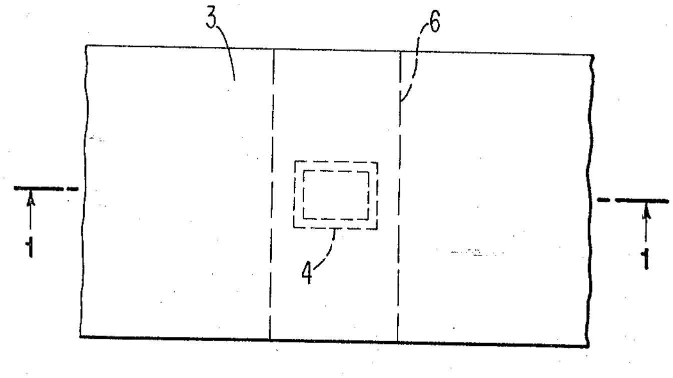
FIG. 2 is a top view of the semiconductor device shown in FIG. 1.

FIG. 2 is a top view of the device of FIG. 1 in which the reference numerals utilized in FIG. 2 are the same as those employed in FIG. 1.

Figure 3:
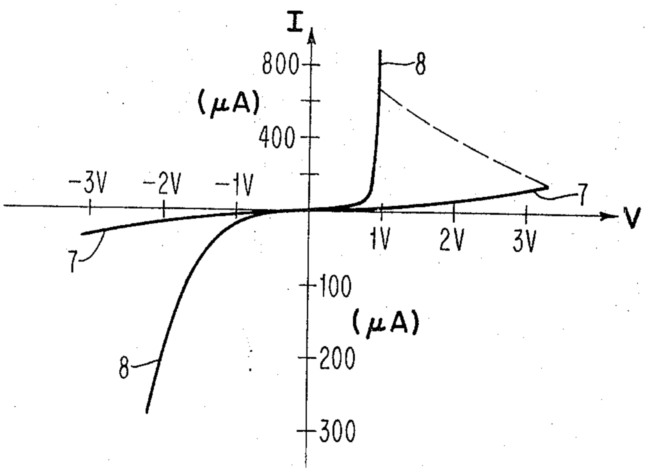
FIG. 3 is a graph showing the electrical switching characteristics of the semiconductor device shown in FIGS. 1 and 2.

In FIG. 3, the electrical characteristics of a heterojunction bistable switching device prepared by the process of this invention as described in FIG. 1 are shown. The high resistance state 7 can be switched into the low resistance state 8 and vice-versa by electrical means. The low resistance state is diode-like instead of ohmic, eliminating the sneak path problem mentioned above. For other discussions of the nitride-silicon bistable switch, reference is made to Applicants' copending application Ser. No. 260,861.

The specific embodiment shown in FIGS. 1, 2 and 3 is representative of only one embodiment of the process of this invention. The silicon dioxide layer shown in FIG. 1 can be deleted with the formation of the gallium nitride or aluminum nitride layer 3 over the entire surface of the semiconductor substrate 1, thus giving rise to a p-type silicon region 4 adjacent the gallium nitride or aluminum nitride source layer 3 throughout the entire surface of the semiconductor substrate. The silicon dioxide layer 2 is only necessary where it is not desired, for structural considerations, to cover the entire surface of the semiconductor substrate with a layer of gallium nitride or aluminum nitride.

The following examples illustrate the process of this invention in greater detail. The examples are given for the purpose of illustration and are not to be interpreted as limiting the scope of the invention.

EXAMPLE 1

A silcion wafer 12 mils in thickness is polished to mirror smoothness on one side. The wafer is n-type, doped with phosphorus to a level of $1 \times 10^{18}$ phosphorus atoms/cm$^3$. The wafer is chemically cleaned in trichloroethylene, acetone, and methyl alcohol, and etched in hydrofluoric acid, rinsed in deionized water and dried. The wafer is then placed into a sputtering chamber provided with a gallium cathode target, which is evacuated to a pressure of $10^{-8}$ Torr. The wafer is then heated to a temperature of 700°C and ionized nitrogen is introduced into the chamber to a pressure of $2 \times 10^{-2}$ Torr. When r.f. power is applied to the sputtering system to a level of 100 watts, gallium metal is sputtered from the gallium cathode target and combines with the ionized nitrogen to form a gallium nitride layer on the silicon substrate, which acts as the anode. The gallium sputtering and deposition of the gallium nitride is continued for a period of 60 minutes, producing a gallium nitride layer 2,000 A in thickness. At the same time, gallium atoms diffuse into the n-type silicon substrate, producing a p-n junction in the silicon at a depth of about 200 A below the silicon-gallium nitride interface. When ohmic contacts of gold - antimony are applied to the silcion substrate and ohmic contacts of indium-aluminum are applied to the gallium nitride by evaporation, a bistable switch with the behavior shown in FIG. 3 results.

EXAMPLE 2

A silicon wafer 12 mils in thickness is polished to mirror smoothness on one side. The wafer is p-type, doped to about $10^{15}$ atoms/cm$^3$ with boron. The wafer is chemically cleaned in trichloroethylene, acetone, and methyl alcohol, followed by etching in hydrofluoric acid, rinsed in deionized water and dried. The wafer is placed in a system for low temperature decomposition of tetra-ethyl-ortho-silicate, and a layer of $SiO_2$ is grown on the wafer surface. Using photoresist photolithographic techniques well known in the art, stripes 10 microns in width are etched in the $SiO_2$ using buffered hydrofluoric acid. The wafer is then placed in a diffusion system and phosphorus is diffused into the stripe areas to a depth of 2 microns with a surface concentration of about $2 \times 10^{18}$ $cm^{-3}$. A second $SiO_2$ layer is deposited over the entire surface, and holes 5 microns in diameter are etched in the second $SiO_2$ layer on top of the previously diffused stripes using photolithography. The wafer is placed in a sputtering chamber provided with an aluminum cathode target, which is evacuated to a pressure of $10^{-8}$ Torr, and the wafer is heated to a temperature of 800°C. The chamber is filled to a pressure of $2 \times 10^{-2}$ Torr with ionized nitrogen. When r.f. power is applied to the sputtering system to a level of 100 watts, aluminum metal is sputtered from the aluminum cathode target and combines with the ionized nitrogen to form an aluminum nitride layer on the silicon substrate and over the oxidized portions as well. The aluminum sputtering and deposition of aluminum nitride is continued for a period of 30 minutes, producing an aluminum nitride layer 3,800 A in thickness. At the same time, aluminum atoms diffuse into the n-type silicon stripes, producing a p-type silicon island and p-n junction at a depth of 600 A from the aluminum nitride-silicon interface. Teh wafer is removed from the sputtering chamber and the aluminum nitride is removed from the unwanted regions by photoresist-lithography techniques and etching in phosphoric acid. The $SiO_2$ is removed from unwanted regions by photoresist-lithography techniques and etching in buffered H F. Ohmic contacts of indium-aluminum are applied to the aluminum nitride and ohmic contacts of gold-antimony are appied to the n-type silicon stripe, and a bistable switch with the electrical behavior shown in FIG. 3 is produced.

While the above invention has been described in detail and with reference to specific embodiments thereof, it will be obvious that various changes and modifications can be made therein without departing from the spirit and scope thereof.

What is claimed is:

1. A process for the preparation of a p-n homojunction between regions of differing conductivity in a semiconductor substrate and a heterojunction at the surface of said substrate comprising growing aluminum nitride or gallium nitride on the substrate to form said heterojunction whereby gallium atoms from said said gallium nitride or aluminum atoms from said aluminum nitride diffuse into said substrate in the regions of said substrate adjacent said aluminum nitride or gallium nitride to form said homojunction in said substrate.

2. The process of claim 1 wherein said semiconductor substrate is silicon, germanium, silicon carbide or germanium carbide.

3. The process of claim 1 wherin said semiconductor substrate is silicon.

4. The process of claim 3 wherein said semiconductor substrate is silicon and where said silicon is n-type silicon, at least in the area of said silicon semiconductor substrate adjacent said aluminum nitride or gallium nitride.

5. The process of claim 1 wherein prior to said growing of said gallium nitride or said aluminum nitride, siad process comprises forming a masking oxide layer on said semiconductor substrate and etching of said oxide layer thereby creating at least one area on said substrate uncovered by said oxide layer.

6. The process of claim 1 wherein said growing is utilizing a volatizable gallium compound and ammonia at a temperaure of from about 700°C to about 900°C. for about 15 minutes to about 2 hours.

7. The process of claim 1 wherein said growing is by sputtering of elemental aluminum or gallium in a reactive nitrogen atmosphere at a temperature of from about 0°C. to about 800°C. for from about 10 minutes to about 4 hours.

8. The process of claim 1 wherein said growing is by vacuum evaporation of elemental aluminum or elemental gallium in a reactive nitrogen atmosphere at a temperature of from about 0°C. to about 800°C. for a period of from about 10 minutes to about 4 hours.

9. A process for the prepartion of a p-n homojunction between regions of differing conductivity in a semiconductor substrate and a heterojunction at the surface of said substrate comprising growing aluminum nitride or gallium nitride on the substrate at a temperature sufficiently low that substantially no diffusion of aluminum or gallium atoms from said aluminum nitride or gallium nitride into said substrate occurs, and subsequent to said growing, said process comprising additionally heating said substrate with said aluminum nitride or gallium nitride thereon at a temperature of from about 600°C. to about 800°C. for said gallium nitride and at temperatures from about 600°C. to about 1,000°C. for said aluminum nitride, under conditions preventing the dissociation of said aluminum nitride or gallium nitride and loss thereof.

10. The process of claim 9 wherein said temperature at which substantially no diffusion occurs is a temperature of from about room temperature to about 500°C.

11. A process for the preparation of a semiconductor device containing both a homojunction and a heterojunction comprising:

forming on a semicondcutor substrate an oxide protective layer so as to create on said substrate areas of said substrate which are covered by said oxide layer and areas which are not covered by said oxide layer, said substrate having n-type characteristics at least in the areas of said substrate not covered by said oxide layer;

growing a layer of aluminum nitride or gallium nitride on said coated substrate so as to form a layer of aluminum nitride or gallium nitride thereon, said growing of said aluminum nitride or gallium nitride layer being at a time and temperature such that gallium atoms from said gallium nitride or aluminum atoms from said aluminum nitride diffuse into said substrate in the regions of said substrate which are not covered by said protective oxide layer and adjacent said aluminum nitride or gallium nitride to form p-n junctions; and attaching electrical terminals to said gallium nitride or aluminum nitride layer and said substrate so as to electrically connected said heterojunction and said p-n junction in series.

12. The process of claim 11 wherein said semiconductor substrate is silicon, germanium, silicon carbide or germanium carbide.

13. The process of claim 11 wherein said semiconductor substrate is silicon.

14. The process of claim 11 where said growing time and temperature are chosen to minimize the diffusion which occurs and in which subsequent annealing is performed at a desired time and temperature to produce the diffusion to a desired depth.

15. A process for the preparation of shallow diffusion depths with very high surface concentrations comprising:

growing a layer of aluminum nitride or gallium nitride onto the surface of a semiconductor substrate at a time and temperature chosen to result in diffusion of the aluminum or gallium from the nitride layer into said substrate to the desired depth.

16. The process of claim 15 in which said semiconductor substrate is silicon.

17. A process for the preparation of shallow diffusion depths with very high surface concentrations comprising:

growing a layer of aluminum nitride or gallium nitride onto the surface of a semiconductor substrate at a time and temperature chosen to result in negligible diffusion of the aluminum or gallium from the nitride layer into said substrate;

annealing said substrate with said nitride layer, subsequent to said growing of said nitride layer, at a time and temperature chosen to result in diffusion of the aluminum or gallium from said nitride layer into said substrate to the desired depth.

18. The process of claim 17 in which said semiconductor substrate is silicon.

* * * * *

UNITED STATES PATENT OFFICE
CERTIFICATE OF CORRECTION

PATENT NO. : 3,869,322
DATED : March 4, 1975
INVENTOR(S) : Jerome J. CUOMO et al It is certified that error appears in the above-identified patent and that said Letters Patent are hereby corrected as shown below:

IN THE SPECIFICATION:

Column 3, line 17 - delete "solid state-solid state" and insert -- solid-state --

Column 5, line 4 - delete "solid-solid" and insert -- solid-state -- line 52 - after "4 hours," delete "mhours,"

Column 6, line 49 - delete "solid-solid" and insert -- solid-state --

IN THE CLAIMS:

Column 11, line 56 - delete "said" (first occurrence)

line 67 - delete "where" and insert -- wherein --

Column 12, line 4 - delete "siad" and insert -- said -- line 10 - delete "volatizable" and insert -- volatilizable --

Signed and sealed this 29th day of April 1975.

(SEAL)
Attest:

RUTH C. MASON
Attesting Officer

C. MARSHALL DANN
Commissioner of Patents
and Trademarks